(12) United States Patent
Whitaker

(10) Patent No.: US 6,434,037 B1
(45) Date of Patent: *Aug. 13, 2002

(54) MUX-BASED ROM USING N-BIT SUBFUNCTION ENCODING

(75) Inventor: Sterling Whitaker, Albuquerque, NM (US)

(73) Assignee: University of New Mexico, Albuquerque, NM (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/686,655

(22) Filed: Oct. 10, 2000

Related U.S. Application Data

(60) Provisional application No. 60/158,602, filed on Oct. 8, 1999.

(51) Int. Cl.[7] .............................................. G11C 17/00
(52) U.S. Cl. ..................... 365/104; 365/94; 365/230.02
(58) Field of Search ..................... 365/94, 104, 189.02, 365/230.02

(56) References Cited

U.S. PATENT DOCUMENTS 4,536,858 A * 8/1985 Ueno ......................... 365/104
4,646,264 A * 2/1987 Matsuzaki .................. 365/104

OTHER PUBLICATIONS

"Multiple–Input, Multiple–Output Pass Transistor Logic" by M. Shamanna, et al., University of New Mexico, Int. J. Electronics, 1995, vol. 79, No. 1, 33–45.

"Mux–Based ROM Using n–Bit Subfunction Encoding" by S. Whitaker, et al., NASA Institute for Advanced Microelectronics University of New Mexico, 8th NASA Symposium on VLSI Design 1999, p. 3.2.1–3.2.7.

* cited by examiner

*Primary Examiner*—Son Mai
(74) *Attorney, Agent, or Firm*—Haverstock & Owens LLP

(57) ABSTRACT

A high-speed, ultra-dense, via contact programmable ROM based on multiplexor cells is presented. High density is achieved by fully encoding n-bits of address space and programming the core with $2^n$ bits of information per contact through the use of higher order logic techniques. Subfunction encoding is used to make substantial improvement to the area required for ROM structures. The programming is accomplished using via contacts between the top two metal layers. No transistors are used in the programmed core for the ROM, reducing the bit line load and helping to maintain a high level of performance.

9 Claims, 3 Drawing Sheets

| $A_{1:0}$ | $Q_0$ |
|---|---|
| 000000 00 | 0 |
| 000000 01 | 1 |
| 000000 10 | 0 |
| 000000 11 | 0 |
| 000001 00 | 0 |
| 000001 01 | 1 |
| 000001 10 | 0 |
| 000001 11 | 0 |
| 000010 00 | 0 |
| 000010 01 | 1 |
| 000010 10 | 0 |
| 000010 11 | 0 |
| 000011 00 | 0 |
| 000011 01 | 1 |
| 000011 10 | 0 |
| 000011 11 | 0 |
| ⋯ | ⋯ |
| 111100 00 | 1 |
| 111100 01 | 1 |
| 111100 10 | 1 |
| 111100 11 | 0 |
| 111101 00 | 1 |
| 111101 01 | 1 |
| 111101 10 | 1 |
| 111101 11 | 1 |
| 111110 00 | 0 |
| 111110 01 | 0 |
| 111110 10 | 0 |
| 111110 11 | 1 |
| 111111 00 | 1 |
| 111111 01 | 1 |
| 111111 10 | 0 |
| 111111 11 | 1 |

*Fig. 3*

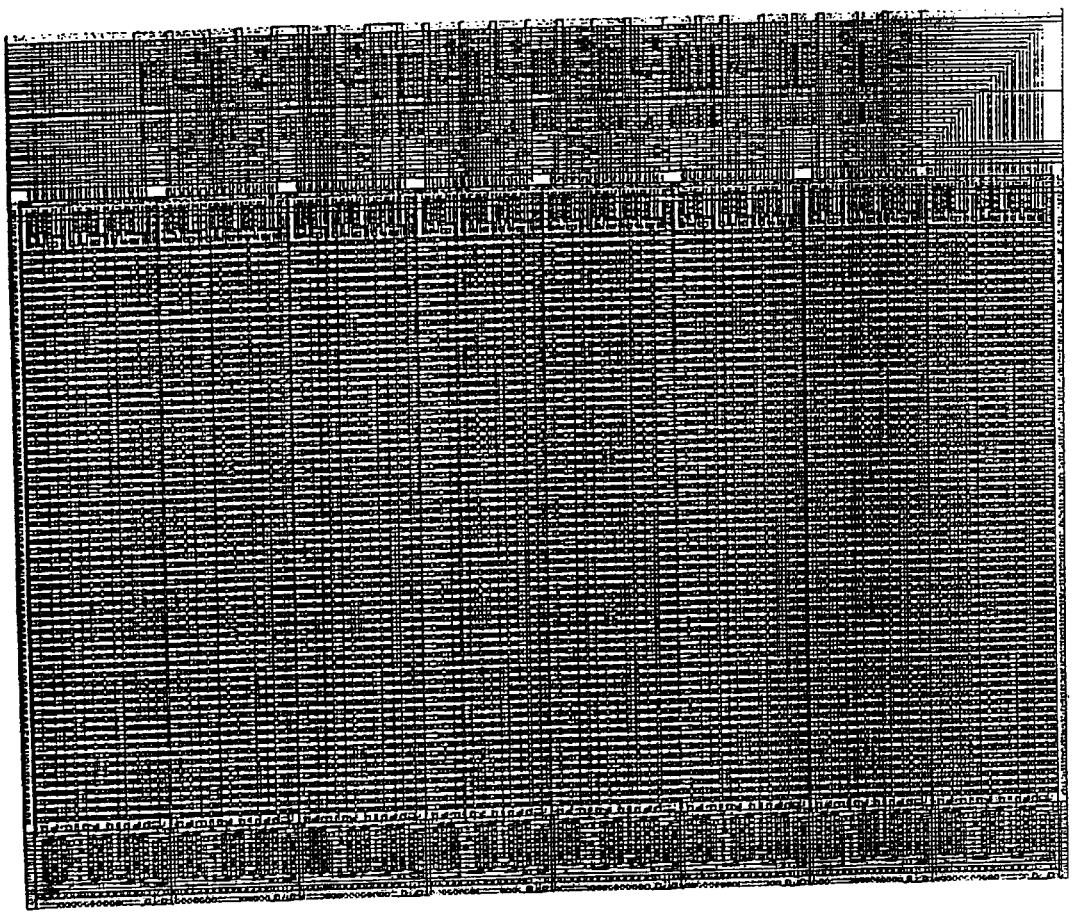
*Fig. 4* Full Custom Layout of a 256x8 ROM

MUX-BASED ROM USING N-BIT SUBFUNCTION ENCODING

RELATED APPLICATION

This application claims priority under 35 U.S.C. §119(e) of the co-pending U.S. provisional application No. 60/158,602 filed on Oct. 8, 1999 and entitled "MUX-Based ROM Using n-Bit Subfunction Encoding." The provisional application Serial No. 60/158,602 filed on Oct. 8, 1999 and entitled "MUX-Based ROM Using n-Bit Subfunction Encoding" is also hereby incorporated by reference.

FIELD OF THE INVENTION

The present invention relates to programmable Read-Only-Memory (ROM). More specifically, the present invention uses a multiplexor and n-bit subfunction encoder to achieve a high-speed, ultra-dense, via contact programmable ROM.

BACKGROUND OF THE INVENTION

A common goal in designing and manufacturing integrated circuits (ICs) is to reduce the size of each IC. Generally, a smaller IC provides several advantages. First, by consuming less space on a wafer, more circuits are produced for the same cost as for a larger IC. Second, a smaller IC will likely operate faster as the signals have less distance to travel on the surface of the IC. In some cases, this may result in lower power consumption by the IC.

There are different ways to reduce the size of an IC. The relative size and spacing of circuits can be reduced. Conventionally, engineers are attempting to manufacture ICs using sub-micron device geometries. Other ways include improved placement of individual circuits on an IC. Such intelligent place and route techniques will reduce the area consumed by interconnect traces.

Still other ways to reduce the size of a digital circuit is to use circuit reduction design techniques such as Karnaugh maps (so-called K-Maps) and Boolean algebra to simplify the common circuits. However, even though this method is a necessary first step that must be performed, it cannot meet today demand to miniaturize the IC circuits. Another method is to use Very Large Scale Integrated Circuit (VLSI) design to add more transistors into a given silicon area. Today's technology can add ten of million of transistors into a given silicon area. However, this VLSI method has its problems and constraints. When transistors and active circuits are packed close together, the heat dissipation and cross talk signals may cause the neighboring transistors to malfunction. Especially when today's technology demands a very fast speed, for example up to the 400 MHz range. There exists a need to find new methods to reduce IC size in sub-micron dimension to meet the demands for ultra-dense and high-speed IC circuitry.

SUMMARY OF THE INVENTION

The present invention in its preferred embodiment represents a high-speed, ultra-dense logic circuit using a contact programmable read-only-memory (ROM) which is controlled using a multiplexor cell technology. According to the invention, high density is achieved by fully encoding n-bits of address space and programming the core with $2^n$ bits of information per contact through the use of higher order logic techniques. Through the use of these subfunctions a circuit can realize a relatively large reduction in area on an IC for implementing a circuit.

A MUX-based ROM uses n-bit subfunction encoding to implement a logic function. A ROM is programmed for selecting one of a plurality of subfunctions. A MUX is coupled to receive an input. The MUX is also coupled to the ROM for selecting subfunction in response to the input. A ROM output provides a signal responsive to the subfunction.

The nature, principle and utility of the present invention will become more apparent from the following detailed description when read in conjunction with the accompanying drawings.

BRIEF DESCRIPTION OF THE DRAWINGS

FIG. 3 is partial Truth Table of the Output and corresponding address.

FIG. 4 illustrates a Full Custom Layout of a 256×8 ROM.

DESCRIPTION OF THE PRESENT INVENTION

Figures 1, 2:
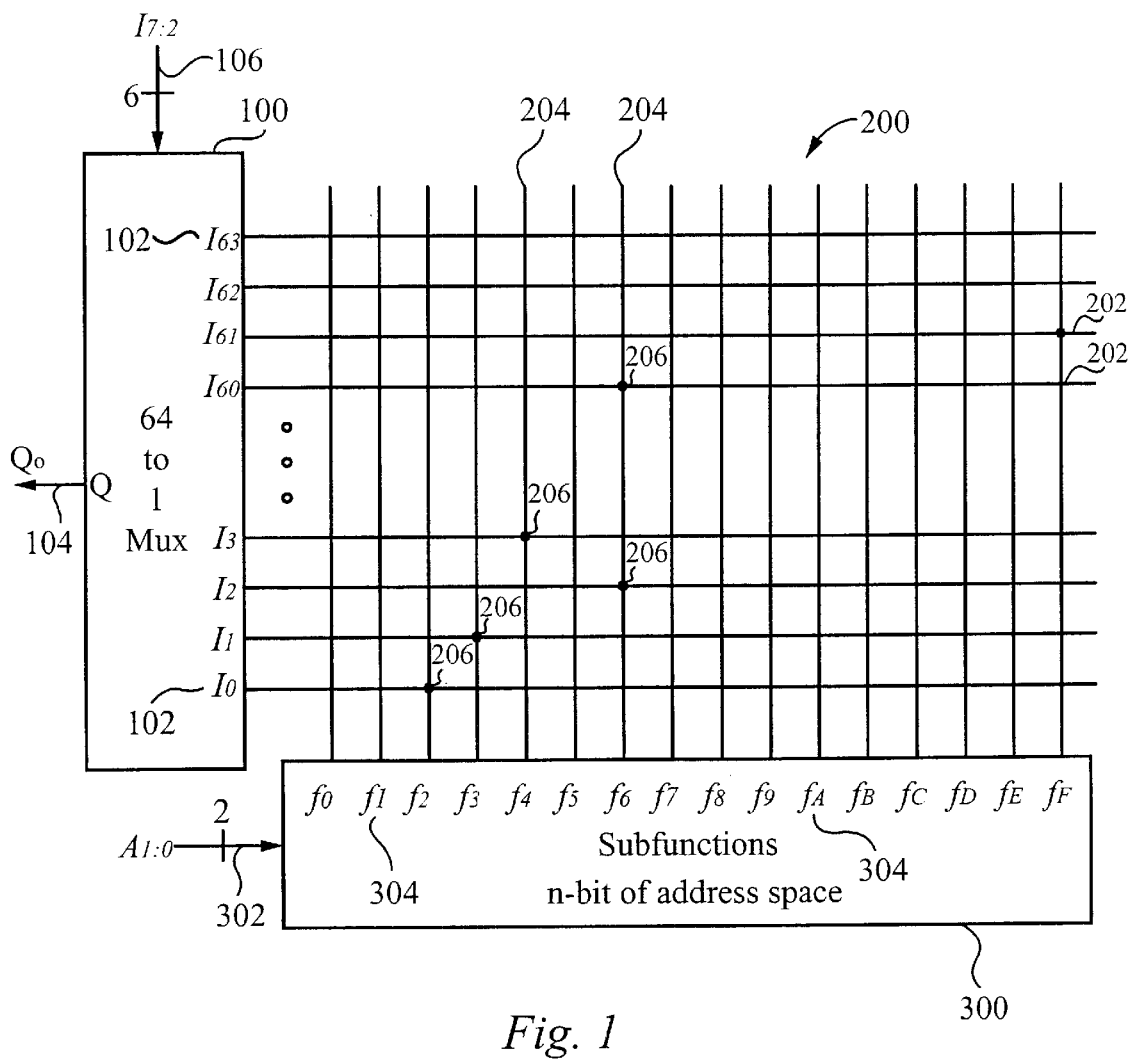
FIG. 1 is a block diagram of a preferred embodiment of the present invention
FIG. 2 is a Truth Table of a fully encoded 2-bit address of the subfunction.

Referring to FIG. 1, the present invention includes a multiplexer (MUX) 100, a ROM core 200 having columns and rows, and a subfunction encoder 300. The MUX 100 is a data selector and well-known in the pertinent art. The MUX 100 comprises $2^k$ data inputs 102, one data output 104, and k-bits of address code 106. Depending on the state of an address code, one data input will be selected and transferred to the output.

The ROM core 200 is a matrix array memory. The ROM core 200 is used to store binary information. As a matrix array memory, the ROM core 200 has rows 202 and columns 204. The intersection between the row 202 and the column 204 forms a cell 206. Information can be stored in the cell 206 of the memory 200 by programming the cells 206. Each cell 206 further comprises a via contact 208, which is not be shown in FIG. 1. A via contact is very well-known in the CMOS process. The example of the array matrix memory 200 used to validate this invention is a full custom layout by the triple metal CMOS process. The triple metal CMOS process is a preferred method because it reduces parasitic capacitance, and increases density, as well as speed as compared to single or double metal processes. The details of the custom layout will be described in a specific example below.

The MUX 100 is electronically coupled to a row of the ROM core 200. The subfunction 300 is electronically coupled to a column of the ROM core 200.

The subfunction encoder 300 is a digital encoder. A conventional encoder has a number of input lines. Conventionally, only one of the input lines is activated at a given time to produce an output code. The output code is dependant on which input is activated. In contrast, the subfunction encoder 300 in this invention uses a subfunction encoding scheme to produce any number of outputs 304 in response to a given selected input 302.

If all possible subfunctions are derived from n address bits, and the remaining k address bits are used to control a $2^k$ to 1 multiplexor to create a logical output, then the state of each output can be provided by activating the appropriate subfunction. The $2^n$ data input MUX 100 is combined with the n-bit subfunction encoder 300 to produce a $2^{k+n} \times 1$ ROM. Therefore, instead of using $2^n$ controlling circuits of the $2^{n-k} \times 1$ by one ROMs, the invention uses the subfunction encoder 300 to generate $2^n$ outputs that couple to the appropriate cells. As a result, the present invention creates a $2^k \times 2^n$ ROM using only one subfunction encoder 300. This results in a substantial saving of silicon area in an IC. A specific example below illustrates the present invention.

256×8 ROM

This example illustrates how to build a 256×8 ROM using the subfunction encoder 300. In this particular example, n=2 and k=6. The MUX 100 has $2^6$ or 64 inputs 102 and one output $Q_0$ 104. With 4-bits per cell, a 256×1 bit ROM can be built using a 64×1 MUX whose inputs are programmed as coupling to the logic which forms all 2-bit functions as shown in FIG. 1.

In a regular method, a 256×8 can be built by cascading 8 256×1 ROMs together. The present invention uses the subfunction encoder 300 whose Truth Table is shown in FIG. 2 as a common controller circuit for all 8 ROMs. The outputs 304 of subfunction encoder 300 are labeled with the hex representation, reading the output from state 302 $A_1 A_0$= 11, or most significant bit (msb) to $A_1 A_0$=00 or least significant bit (lsb). The Truth Table in FIG. 2 shows that in any state, there are always 8 subfunction outputs ON, i.e., having the logic the state 1. The MUX 100 passes the appropriate state of the selected subfunction outputs 304 to the output $Q_0$ 104 of the MUX 100. A person with ordinary skill in the pertinent can use the Truth Table in FIG. 1 to build and layout a digital subfunction encoder 300. FIG. 2 is the Partial Truth Table of the 256 by 8 ROM.

The core of the ROM contains no transistors. The ROM programming resides in via couplings to the appropriate subfunction. Each of these couplings conveys 4 bits of information. The programing shown in FIG. 1 implements the partial truth table shown in FIG. 2. The correspondence between the couplings and the truth table can be seen by studying the 4 state divisions of the partial truth table. For example, when $A_7 A_6 A_5 A_4 A_3 A_2$=000000, the subfunction needed is $f_2$. Io input to the multiplexor is coupled to $f_2$. With $A_7 A_6 A_5 A_4 A_3 A_2$=000001, the required subfunction is $f_3$. The input 102 to the multiplexor is coupled to one of the outputs 304 $f_3$ and so forth. The 256×8 ROM is made from eight 64 to 1 multiplexors sharing a common subfunction section.

The present invention uses a triple metal CMOS process to layout the 256×8 ROM. This Very Large Scale Integrated Circuit (VLSI) is well-known in the pertinent art. FIG. 4 shows the full custom layout of the 256×8 ROM. For full custom layout, the ROM core comprises 16 metal 3 lines spaced and sized to allow via contacts 208 in each time. These lines are driven by the fully encoded outputs of the least significant 2 bits of address and run perpendicular to a mesh of 64 metal 2 lines. The metal 2 lines drive the inputs 102 to the multiplexor 100. Since these contacts 208 are the multiplexor inputs 102, the spacing of the metal 2 lines is set by the metal 1 contact to diffusion spacings and overlaps along diffusion to diffusion spacing rule required by multiplexor inputs 102. The multiplexors 100 were drawn using only metal 1 allowing the cell to reside under the contact programmable metal 3, metal 2 array. In a 0.35 triple metal CMOS process, the full custom layout is 156.4 micrometers by 126.0 micrometers and is shown in FIG. 4. This represents an area of only 0.71 times that required by a full custom nor ROM in the same process. Spice simulations demonstrate 400 MHz operation for the unloaded full custom ROM.

Alternative Embodiments

It will be understood that even though various embodiments of the present invention have been set forth in the foregoing description, the above disclosure is illustrative only, and changes may be made in detail, yet remain within the broad principles of the invention.

Other substantially same methods of generating and sharing subfunctions between MUX based Read Only Memory (ROM) to reduce layout area and to increase speed are alternative embodiments of the present invention. Other memory arrays used in the pertinent art can be used as alternative embodiments of this invention. Furthermore, the description describes the MUX 100 is electrically coupled to the row 202 of the core, and the subfunction 300 is electrically coupled to the column 204. It will be understood after reading this document that one alternative arrangement of the ROM couples the MUX is to one side of the core 200, and the subfunction 300 is to another side.

Furthermore, the alternative embodiments to the subfunction encoder include other high level combinatorial digital circuits. VLSI techniques other than the triple metal CMOS process can be used to fabricate the MUX based ROM without losing the essence of the present invention. The methods resulted from using different alternative embodiment devices are also alternative embodiments of this invention.

Results

With the common subfunction encoder 300 as a common controller circuits for all 8 256×1 ROM, the present invention teaches a new method to reduce further the size of an IC ROM. FIG. 4 illustrates the complete 256×8 ROM layout using Avant. This CAD tool places and routes a 0.35 $\mu$m MUX based standard cell library. This encoding scheme results in a layout 425 $\mu$m by 134.4 $\mu$m which occupy an area of less than 2.06 times the area of a full custom hand-crafted nor ROM layout drawn in the same process. This ROM was used on a Reed Solomon decoder chip (RS5) designed for NASA which is capable of correcting of 5 bytes of errors per block of data. Simulations show that the RS5 decoder will run in excess of 125 MHz allowing an 1 Gbits/sec data stream to be decoded and corrected. Simulations of the unloaded ROM show that it will run in excess of 200 MHz.

In addition to the obvious area advantage of subfunction encoding, two other distinct advantages exist over prior art. First, there are no transistors in the core containing the program. This reduces the load on the bit lines and increase the speed of the ROM core, overcoming speed loss introduced by series of pass transistors in the multiplexor. There are also advantages in fabrication since only the last metal and via layers are involved in programming the ROM. This allows personalization of the ROM to occur very late in the fabrication process. Cip for late stage programming

What is claimed is:

1. A programmable Read Only Memory (ROM) comprising:
   a ROM core;
   a multiplexer electrically coupled to the column of the ROM core; and
   a subfunction encoder electrically coupled to the row of the ROM core.

2. The programmable ROM of claim 1 wherein the ROM core is a matrix array memory.

3. The matrix array memory of claim 2 comprising programmable cells.

4. The programmable cells of claim 3, wherein each cell comprises via contacts using higher order logic techniques to store information.

5. The via contacts of claim 4, wherein each via contact uses higher order techniques to store functional information.

6. The programmable cells of claim 3 wherein each via contact stores $2^n$ bits of information.

7. The programmable ROM of claim 1 wherein the encoder comprising:
   an n-bit address space; and
   a plurality of outputs.

8. The system of claim 6, wherein the encoder uses a n-bit subfunction encoding scheme to encode the n-bit of address space.

9. A MUX-based ROM using n-bit subfunction encoding comprising:
   a. a ROM programmed for selecting one of a plurality of subfunctions;
   b. a MUX coupled to receive an input and also coupled to the ROM for selecting subfunction in response to the input; and
   c. an output for providing a signal responsive to the subfunction.

* * * * *

UNITED STATES PATENT AND TRADEMARK OFFICE
CERTIFICATE OF CORRECTION

PATENT NO.    : 6,434,037 B1
DATED         : August 13, 2002
INVENTOR(S)   : Sterling Whitaker It is certified that error appears in the above-identified patent and that said Letters Patent is hereby corrected as shown below:

Column 2,
Line 66, replace "$2^{n-k}$ x 1 by one ROMs" with -- $2^{n+k}$ by one ROMs --.

Signed and Sealed this

Thirty-first Day of December, 2002

JAMES E. ROGAN
*Director of the United States Patent and Trademark Office*